United States Patent
Nishizawa et al.

(10) Patent No.: US 6,469,593 B2
(45) Date of Patent: Oct. 22, 2002

(54) SURFACE ACOUSTIC WAVE DEVICE, COMMUNICATION DEVICE USING THE SAME, AND ANTENNA DUPLEXER

(75) Inventors: Toshio Nishizawa; Masanori Ueda; Osamu Kawauchi; Kiyohide Misawa; Hiroyuki Furusato, all of Nagano (JP)

(73) Assignee: Fujitsu Media Devices Limited, Nagano (JP)

( * ) Notice: Subject to any disclaimer, the term of this patent is extended or adjusted under 35 U.S.C. 154(b) by 0 days.

(21) Appl. No.: 09/757,490

(22) Filed: Jan. 11, 2001

(65) Prior Publication Data

US 2002/0057141 A1 May 16, 2002

(30) Foreign Application Priority Data

Mar. 17, 2000 (JP) ........................................ 2000-075177

(51) Int. Cl.⁷ .............................. H03H 9/64; H03H 9/72
(52) U.S. Cl. ...................... 333/133; 333/193; 333/195; 310/313 R
(58) Field of Search ........................ 333/133, 193–196; 310/313 R, 313 B, 313 C, 313 D

(56) References Cited

U.S. PATENT DOCUMENTS

| | | | | |
|---|---|---|---|---|
| 4,737,742 A | * | 4/1988 | Takoshima et al. | 333/193 X |
| 5,523,641 A | * | 6/1996 | Yatsuda et al. | 310/313 R |
| 5,631,612 A | * | 5/1997 | Satoh et al. | 333/193 |
| 5,712,523 A | * | 1/1998 | Nakashima et al. | 310/313 R |
| 5,874,869 A | * | 2/1999 | Ueda et al. | 333/193 |
| 6,037,847 A | * | 3/2000 | Ueda et al. | 333/193 |
| 6,137,380 A | * | 10/2000 | Ushiroku et al. | 333/193 |
| 6,150,904 A | * | 11/2000 | Taniguchi et al. | 333/193 |
| 6,339,365 B1 | * | 1/2002 | Kawase et al. | 333/133 X |

FOREIGN PATENT DOCUMENTS

| | | | |
|---|---|---|---|
| JP | 10-70435 | | 3/1998 |
| JP | 10-200370 | * | 7/1998 |
| JP | 11-234085 | * | 8/1999 |
| JP | 2000-165185 | * | 6/2000 |

* cited by examiner

*Primary Examiner*—Robert Pascal
*Assistant Examiner*—Barbara Summons
(74) *Attorney, Agent, or Firm*—Arent Fox Kintner Plotkin & Kahn

(57) ABSTRACT

A surface acoustic wave device includes a package having a coefficient of linear expansion; and a piezoelectric element forming a surface acoustic wave element, and mounted on the package by a flip chip bonding. The piezoelectric element has different coefficients of linear expansion in a direction of propagation of surface acoustic waves generated by an interdigital electrode of the surface acoustic wave element and in a vertical direction thereto, and further has a long side existing to a direction having a coefficient of linear expansion close to the coefficient of linear expansion of the package. The piezoelectric element is cut out from a single crystal having X, Y, and Z crystal axes, and the X crystal axis agrees with a direction of propagation of the surface acoustic wave.

5 Claims, 16 Drawing Sheets

SURFACE ACOUSTIC WAVE DEVICE, COMMUNICATION DEVICE USING THE SAME, AND ANTENNA DUPLEXER

BACKGROUND OF THE INVENTION

1. Field of the Invention

The present invention relates generally to a surface acoustic wave device and a communication device using the same. More particularly, the present invention relates to a surface acoustic wave device which uses a flip chip bonding technology, can be downsized, and further has high reliability, and a communication device using the same.

2. Description of the Related Arts

In recent years, starting with a portable telephone, a downsizing of a communication device is conspicuous. Together with a tendency of such the downsizing of the device, a demand of a downsizing and a reduction in heights of parts for use therein is increased.

In particular, in the communication device, a filter, a resonator, and a delay line device are essential parts, and the downsizing thereof is realized by a SAW (Surface Acoustic Wave) device using a flip chip bonding technology.

FIGS. 1A and 1B are schematic cross-sectional views showing a method for mounting on a package of such a surface acoustic wave device.

FIG. 1A shows a method for mounting on the package of the surface acoustic wave device by a wire bonding technology. The surface acoustic wave element is formed on a piezoelectric element (chip) 1.

This piezoelectric element 1 is mounted on a package 2 having a recess part formed with a dielectric material such as ceramics, etc., and is pasted and fixed with a conductive adhesive material 3. After the piezoelectric element 1 is mounted on the package 2, it is sealed by a cap 5. Furthermore, a conductor metal plate connected to a ground terminal 4 of the reverse face is provided on an outer surface of the package 2 or metal plating.

Here, an appropriate electrode on the piezoelectric element 1 is connected to an electrode corresponding to the package 2 via an Al wire 6. Accordingly, a predetermined size is required in a height direction according to the Al wire 6.

In this manner, in the case of the wire bonding technology shown in FIG. 1A, a reduction in heights is limited. FIG. 1B shows an example using a flip chip bonding technology as a technology for solving this.

In comparison with FIG. 1A, in the flip chip bonding technology of FIG. 1B, an appropriate electrode on the piezoelectric element 1 is connected to an electrode corresponding to the package 2 via an Au bump 7. Accordingly, compared with a height direction in the case of the Al wire 6, a reduction in heights is possible.

Here, in the flip chip bonding technology of FIG. 1B, a connection face between the piezoelectric element 1 and the package 2 is determined by a size of the Au bump 7, and becomes smaller than the case of the wire bonding technology. On the other hand, a difference in coefficients of linear expansion between the piezoelectric element 1 and the package 2 for general use exists.

For this reason, at the time of a temperature cycle given at a test stage, a stress load applied on the bump 7 is increased. This is a factor (disconnection, etc.) which reduces reliability in the device, and further a factor which prevents that the flip chip bonding technology is adopted for the downsizing.

SUMMARY OF THE INVENTION

Accordingly, the present invention solves such problems, and it is an object thereof to provide a surface acoustic wave device which enables a downsizing and high reliability, and a communication device using the same.

In order to solve such a deficiency, according to a first aspect of the present invention there is provided a surface acoustic wave device, comprising a package having a coefficient of linear expansion; and a piezoelectric element forming a surface acoustic wave element, and mounted on the package by a flip chip bonding. The piezoelectric element has different coefficients of linear expansion in a direction of propagation of surface acoustic waves generated by an interdigital electrode of the surface acoustic wave element and in a vertical direction thereto, and further having a long side existing to a direction having a coefficient of linear expansion close to the coefficient of linear expansion of the package.

Preferably, the piezoelectric element further has electrode patterns, and a position of a bump which connects the electrode patterns with the package is disposed point-symmetrically to a center of the piezoelectric element.

Preferably, the electrode patterns are formed so that a distance from a center of the piezoelectric element is ½ or less of a short side of the piezoelectric element.

Preferably, the surface acoustic wave element has the electrode patterns configuring a ladder-type filter. All positions of the bump which connects the electrode patterns with the package are preferably disposed at a side closer to a center of the piezoelectric element than a resonator disposed at a side of the short side of the ladder-type filter.

In order to solve the above deficiency, according to a second aspect of the present invention there is provided a surface acoustic wave device, comprising a package having a coefficient of linear expansion; and two piezoelectric elements forming a surface acoustic wave element, and mounted on the package by a flip chip bonding. Each of the two piezoelectric elements has different coefficients of linear expansion in a direction of propagation of surface acoustic waves generated by an interdigital electrode of the surface acoustic wave element and in a vertical direction thereto, and having a long side existing to a direction having a coefficient of linear expansion close to the coefficient of linear expansion of the package, and further having respective different central frequencies.

Preferably, ground electrodes of the surface acoustic wave element formed respectively on the two piezoelectric elements are common in the package.

Preferably, the ground electrodes of the surface acoustic wave elements formed respectively on the two piezoelectric elements are independent in the package.

Preferably, the surface acoustic wave element is a double mode type filter, in which an input side ground electrode and output side ground electrode of the filter are separated in the package.

Preferably, the surface acoustic wave element formed in any one of the two piezoelectric elements is a cascade-connected double mode type filter, in which an input side ground electrode and output side ground electrode of the filter are separated in the package.

The piezoelectric element may be cut out from a single crystal having X, Y, and Z crystal axes, and the X crystal axis agrees with a direction of propagation of the surface acoustic waves.

The piezoelectric element may be cut out from a $LiTaO_3$ single crystal rotated around the X axis at a rotated angle from the Y axis to the Z axis, the rotated angle being in a range between 40° and 44°.

The above and other objects, aspects, features and advantages of the present invention will become more apparent from the following detailed description when read in conjunction with the accompanying drawings.

DESCRIPTION OF THE PREFERRED EMBODIMENTS

Figure 1A:
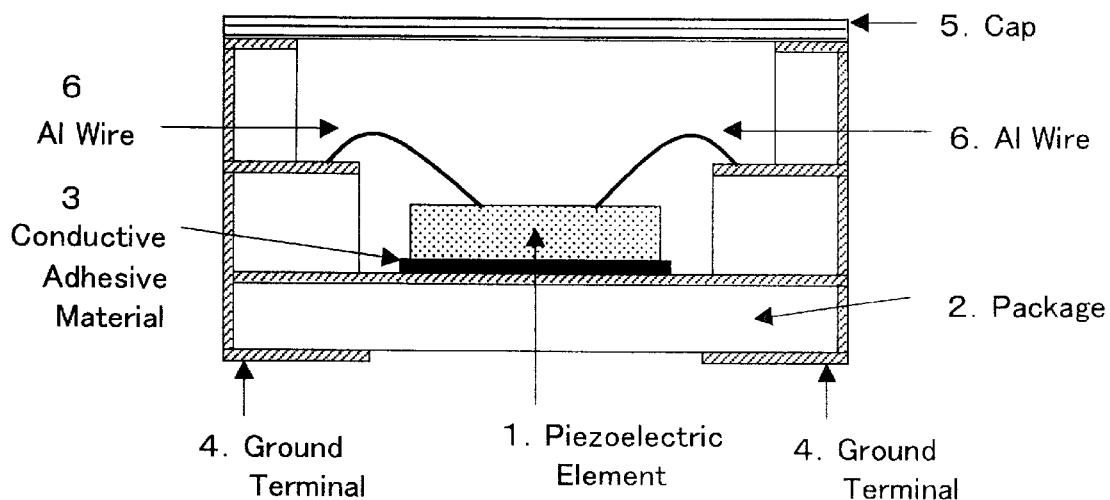
FIGS. 1A and 1B are schematic cross-sectional views showing a method for mounting on a package of a surface acoustic wave device.

Hereinafter, embodiments of the present invention will be explained. Incidentally, in the drawings, the same reference numerals or reference symbols are assigned to the same or similar components or elements for explanation.

Figure 2:
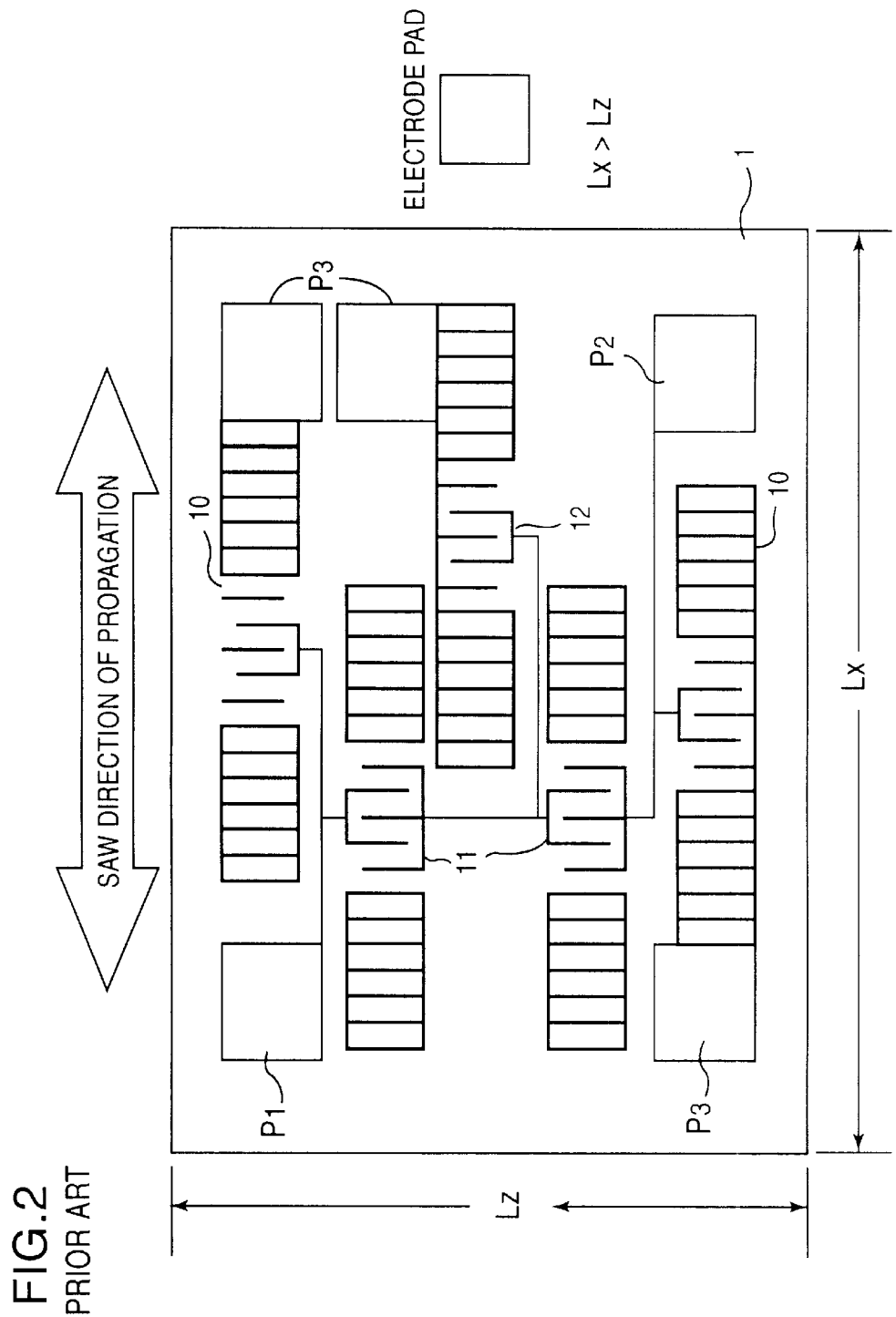
FIG. 2 is a plan of a piezoelectric element 1 formed with a conventional surface acoustic wave element.

FIG. 2 is a plan view of a piezoelectric element 1 formed with a conventional surface acoustic wave element.

Here, the piezoelectric element 1 is obtained by further dividing a piezoelectric substrate (wafer) cut out at a predetermined angle from a single crystal, for example, $LiTaO_3$ having X, Y, and Z crystal axes into a plurality of rectangular parallelepiped chips. The piezoelectric element 1 has a side along the crystal axis. In the example of FIG. 2, a long side Lx is a side along the X axis, and a short side Lz is a side along the Z axis.

Figure 3:
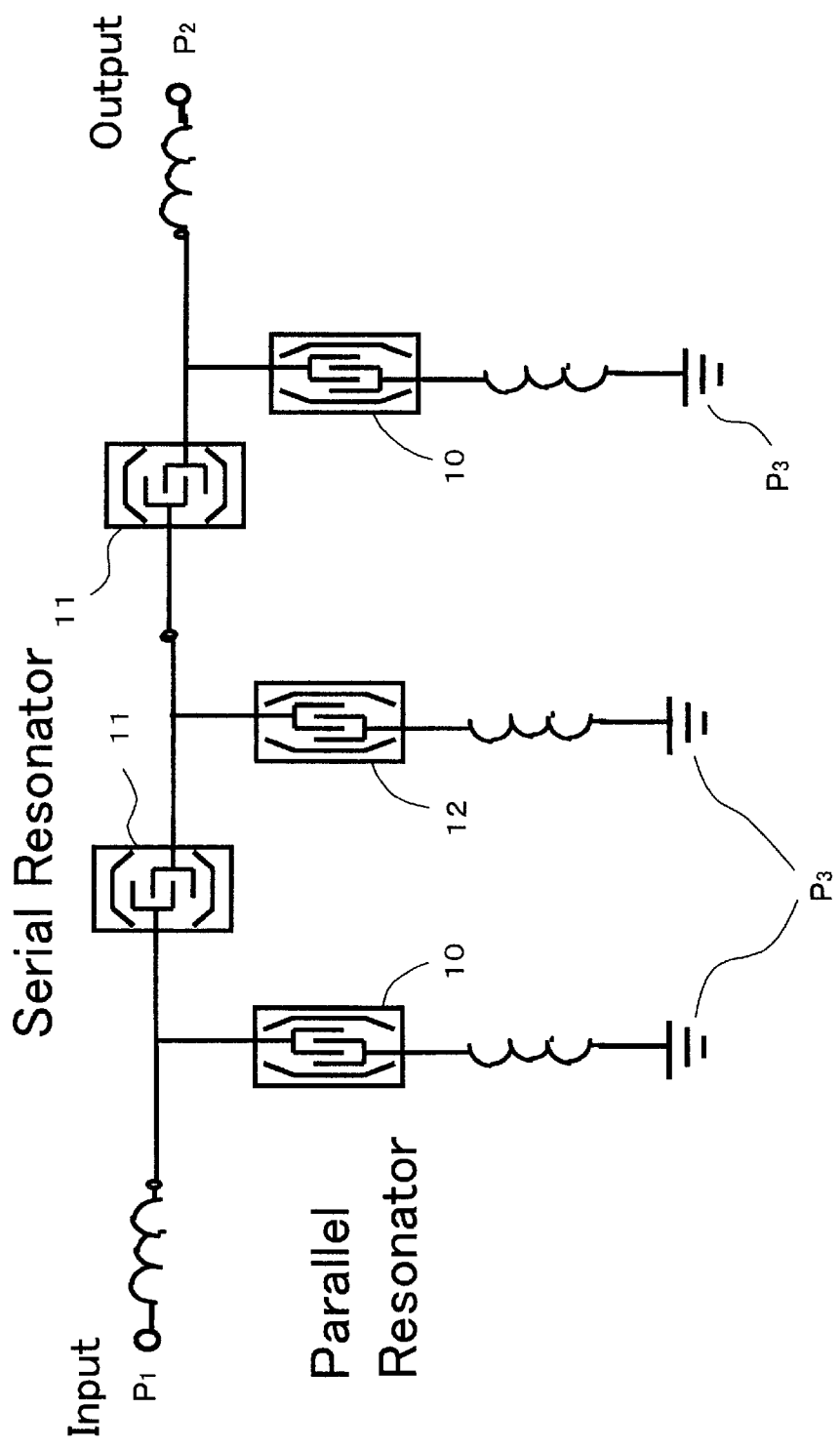
FIG. 3 is an equivalent circuit of a ladder type filter by the surface acoustic wave element of FIG. 2.

The surface acoustic wave element formed on the piezoelectric element 1 has interdigital electrodes 10, 12, 11, and is connected to an input electrode pad $P_1$, an output electrode pad $P_2$, and a ground electrode pad $P_3$ so that the interdigital electrodes 10, 12 are configured as parallel-resonators, and the interdigital electrode 11 is configured as a serial-resonator, and constitutes a ladder-type filter. FIG. 3 is an equivalent circuit of the ladder-type filter composed of the surface acoustic wave element of FIG. 2, which has two steps of the serial-resonation circuit 11, and three steps of the parallel-resonance circuit.

Here, in FIG. 2, a long side Lx of the piezoelectric element 1 agrees with a direction of propagation of the surface acoustic wave (SAW) by the interdigital electrode of the surface acoustic wave element. Furthermore, this piezoelectric element 1 differs between a coefficient of linear expansion in a direction of the long side Lx and a coefficient of linear expansion in a direction of a short side Lz.

The crystal axis as the direction of propagation of these surface acoustic waves (SAW) and the coefficient of linear expansion in directions of respective sides are single-significant according to a type and cutout angle of the single crystal of the cut-out piezoelectric substrate.

For example, in the piezoelectric substrate cut out from the $LiTaO_3$ single crystal, the coefficient of linear expansion in the direction of propagation (in a direction along an X axis) of the surface acoustic wave is $\alpha x=16.1$ ppm, and the coefficient of linear expansion in the vertical direction (in a direction along a Z axis) thereof is $\alpha z=9.5$ ppm.

Figure 1B:
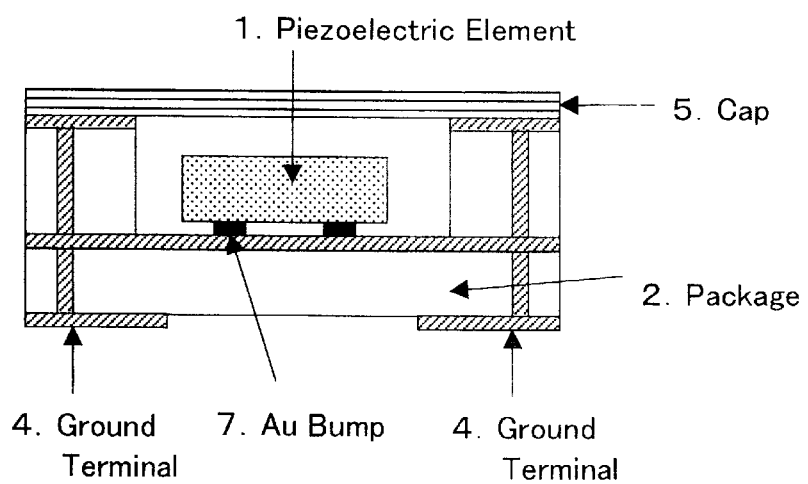

On the other hand, in the case where the piezoelectric element 1 shown in FIG. 2 is mounted on the package by the flip chip bonding technology, the piezoelectric element 1 is connected to electrodes on the package 2 by a bump 7 at positions corresponding to respective electrode pads $P_1$, $P_2$, $P_3$, as shown in FIG. 1.

However, the package 2 itself has the coefficient of linear expansion. For example, in the case of using a ceramic package, the coefficient of linear expansion is about $\alpha=7$ to 8 ppm.

Accordingly, in the piezoelectric element 1 shown in FIG. 2, a difference between the coefficient of linear expansion of a side in the direction of propagation of the surface acoustic wave, namely the long side Lx and the coefficient of linear expansion of the package 2 is increased, and in this case, a large stress is applied on the bump 7, resulting in that a problem occurs in reliability in connection.

Figure 4:
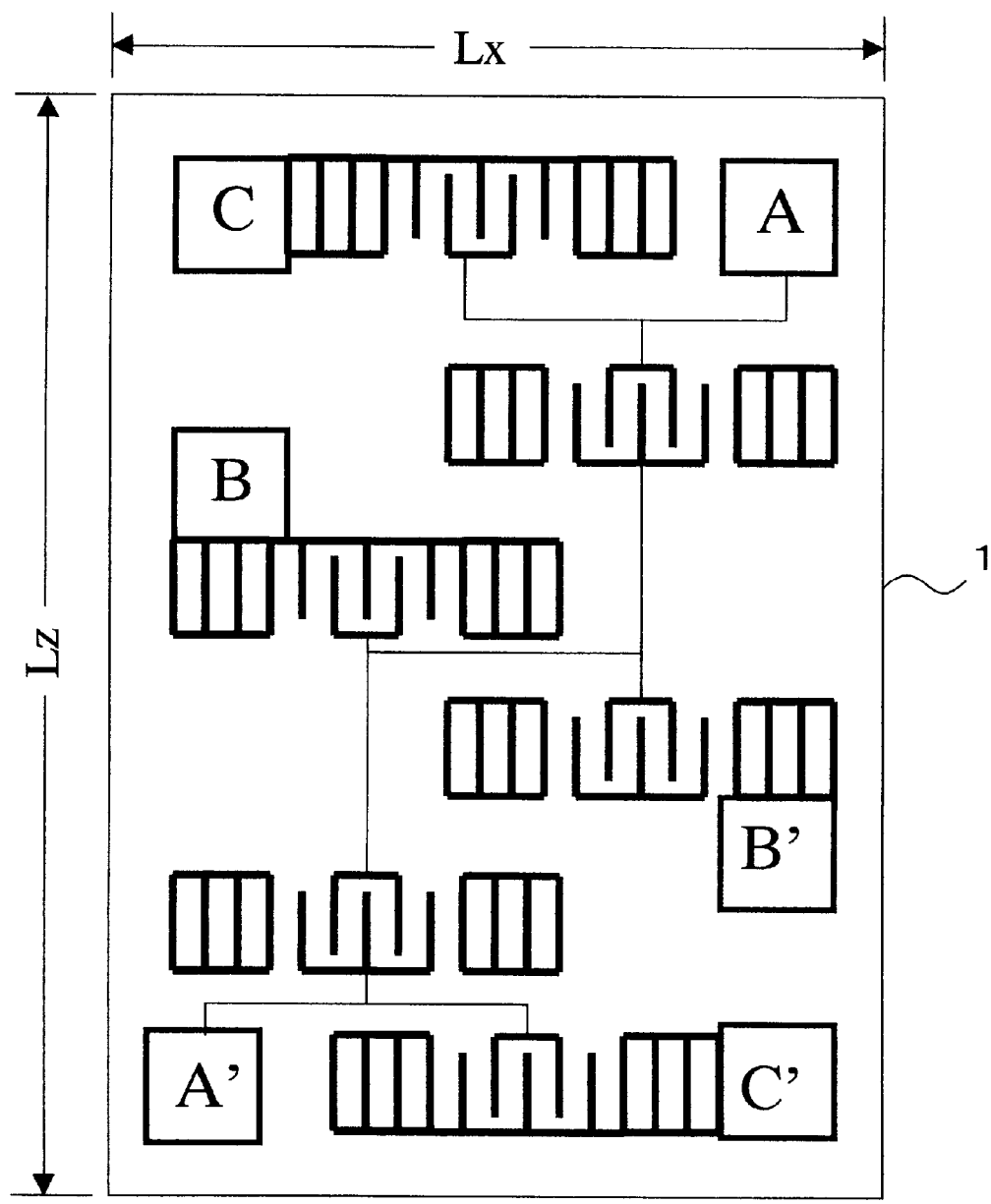
FIG. 4 is a diagram showing a configuration according to an embodiment of the present invention for solving a problem of a configuration of FIG. 2.

The present invention solves such the problem, and FIG. 4 shows a configuration of one embodiment, and is a plan view of the piezoelectric element 1, same as in FIG. 2. According to the embodiment of FIG. 4, in comparison with the example of FIG. 2, the long side of the piezoelectric element 1 is counter to the short side thereof. Namely, the long side Lz is a side along a Z axis, and the short side Lx is a side along an X axis.

In this manner, according to the present invention, the side Lz closer to the coefficient of linear expansion of the package 2 is configured as a long side. Thus, in comparison with the prior art shown in FIG. 2, a stress for the bump 7 can be decreased.

By the way, in the piezoelectric substrate cut out from the above $LiTaO_3$ single crystal rotated around the X axis at a rotated angles of 40 degrees, 42 degrees, and 44 degrees from the Y axis to the Z axis, the coefficient of linear expansion in a direction along the X axis is $\alpha x=16.1$ ppm, and the respective coefficients of linear expansion in a direction along the Z axis are $\alpha z=9.1$ ppm, 9.5 ppm, and 9.9 ppm. Therefore, even in the case where the piezoelectric substrate is cut out at any rotational angles, in comparison with a direction along the X axis, the coefficient of linear expansion of a ceramic package is close to $\alpha=7$ to 8 ppm.

Furthermore, as another example, in the case of using $LiNbO_3$, in the case where the rotational angle from the Y axis to the Z axis is 41 degrees around the X axis, the coefficient of linear expansion in an X axial direction is $\alpha x=15.4$ ppm, and the coefficient of linear expansion in a Z direction is $\alpha z=10.9$ ppm, and in the case of 64 degrees, the coefficient of linear expansion in the X axial direction is $\alpha x=15.4$ ppm, and the coefficient of linear expansion in the Z direction is $\alpha z=13.9$ ppm. In this case also, the coefficient of linear expansion in the direction along the Z axis is closer to the coefficient of linear expansion of the ceramic package $\alpha=7$ to 8 ppm than to the coefficient of linear expansion in the X axial direction.

Figure 5:
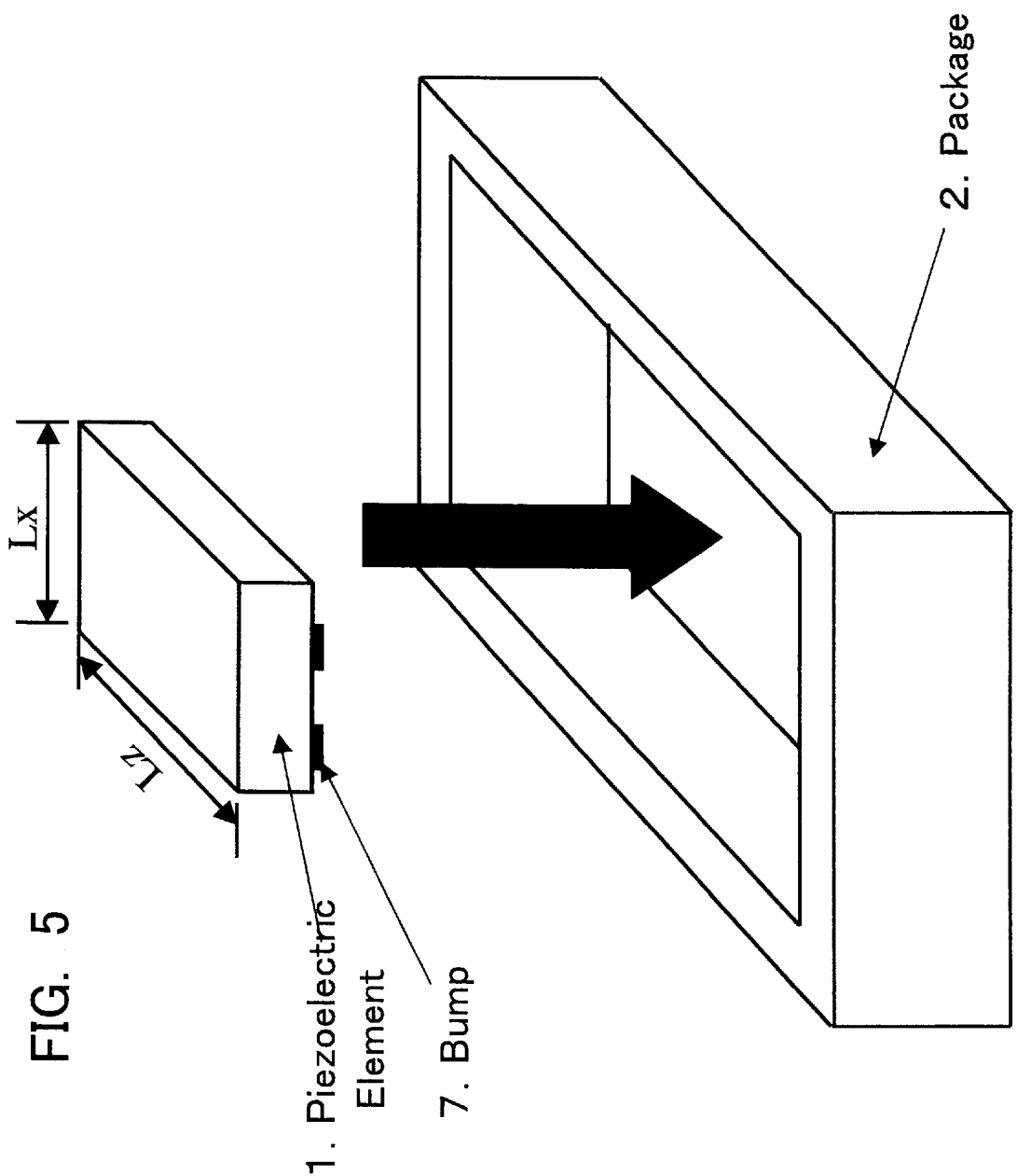
FIG. 5 is a view for explaining a mounting on a ceramic package of the piezoelectric element.

In any case, the direction along the Z axis having the coefficient of linear expansion closer to the coefficient of linear expansion of the ceramic package is set as a long side, it is possible to decrease the stress load for the bump. In this manner, according to the present invention, by using the piezoelectric element 1 in which the direction along the crystalline axis having the coefficient of linear expansion closer to the coefficient of linear expansion of the package 2 is set as a long side, this piezoelectric element 1 is mounted on the ceramic package 2 as shown in FIG. 5, connecting with the electrode in response to the package 2 via the bump 7. Thus, the surface acoustic wave device high in reliability can be obtained.

Returning to FIG. 4, another characteristic of the present invention will be explained. That is, in FIG. 4, electrode pads A, A', and B, B', and C, C' are disposed point-symmetrically to a center of the piezoelectric element 1, respectively.

In this manner, the electrode pads are disposed point-symmetrically to a center of the piezoelectric element 1, the stress loads applied on the bumps in response to positions of the electrode pads can be dispersed respectively, and the stress can be scattered.

The above adaptation of the present invention is not limited to the surface acoustic wave element having a ladder-type interdigital electrode structure shown in FIG. 4, as the surface acoustic wave element formed on the piezoelectric element 1, but contains also justly the case where the surface acoustic wave element having another interdigital electrode structure is formed.

Figure 6:
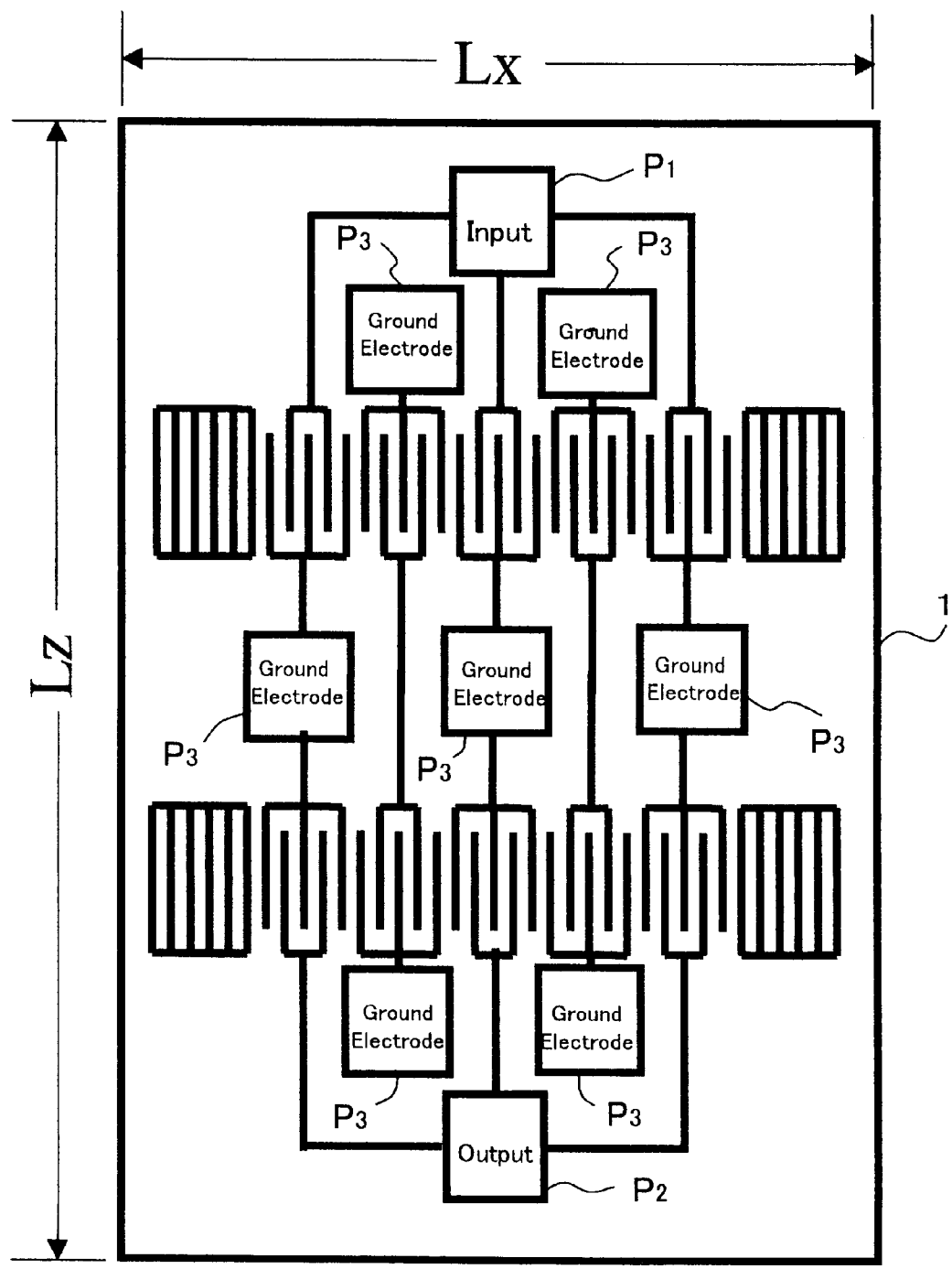
FIG. 6 is an example of the surface acoustic wave element having an interdigital electrode configuration according to the present invention, and is a diagram showing an example of an IIDT (Interdigitated Interdigital Transducer) type filter.
Figure 7:
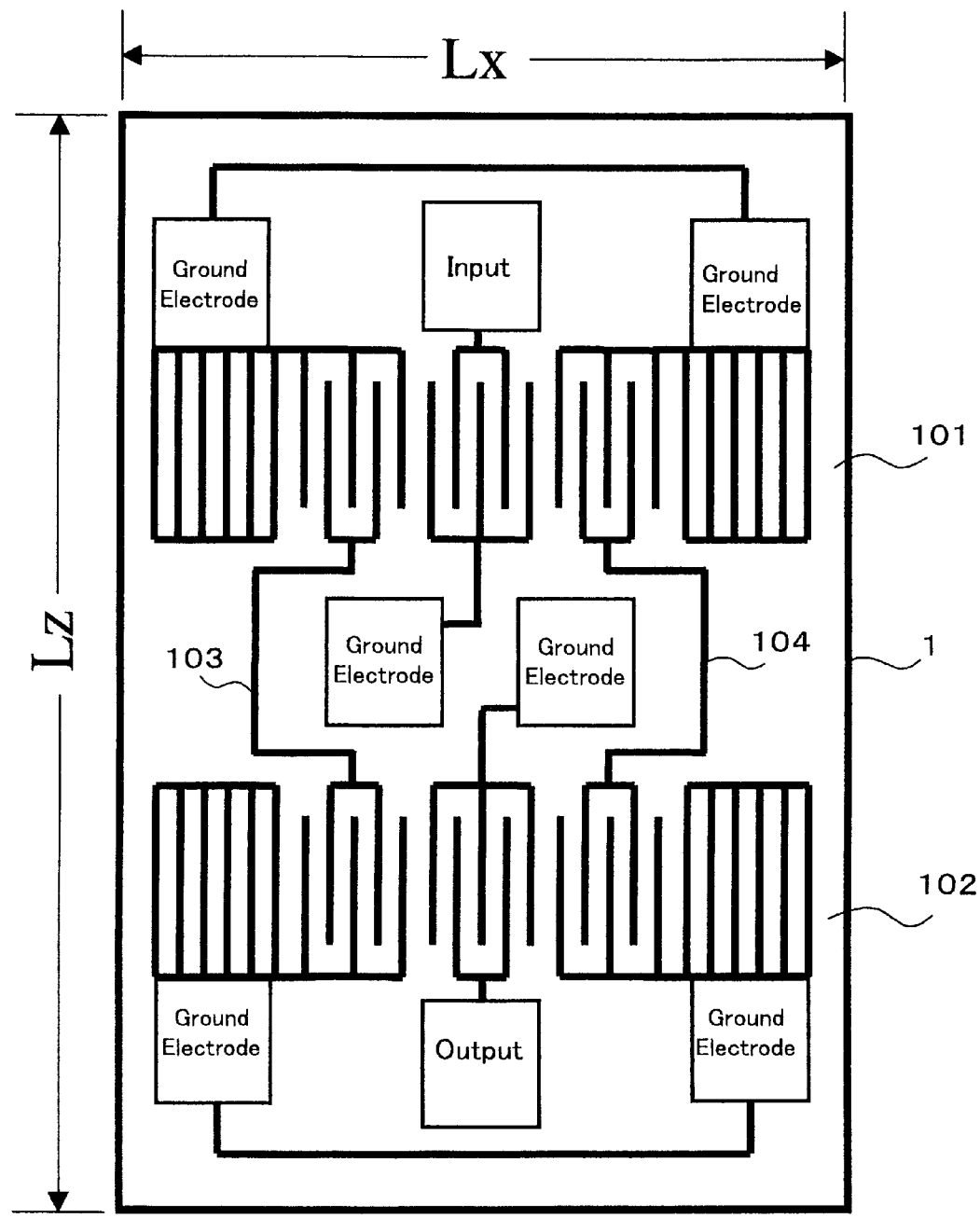
FIG. 7 is an example of a cascade-connected double mode type filter according to the present invention.
Figure 8:
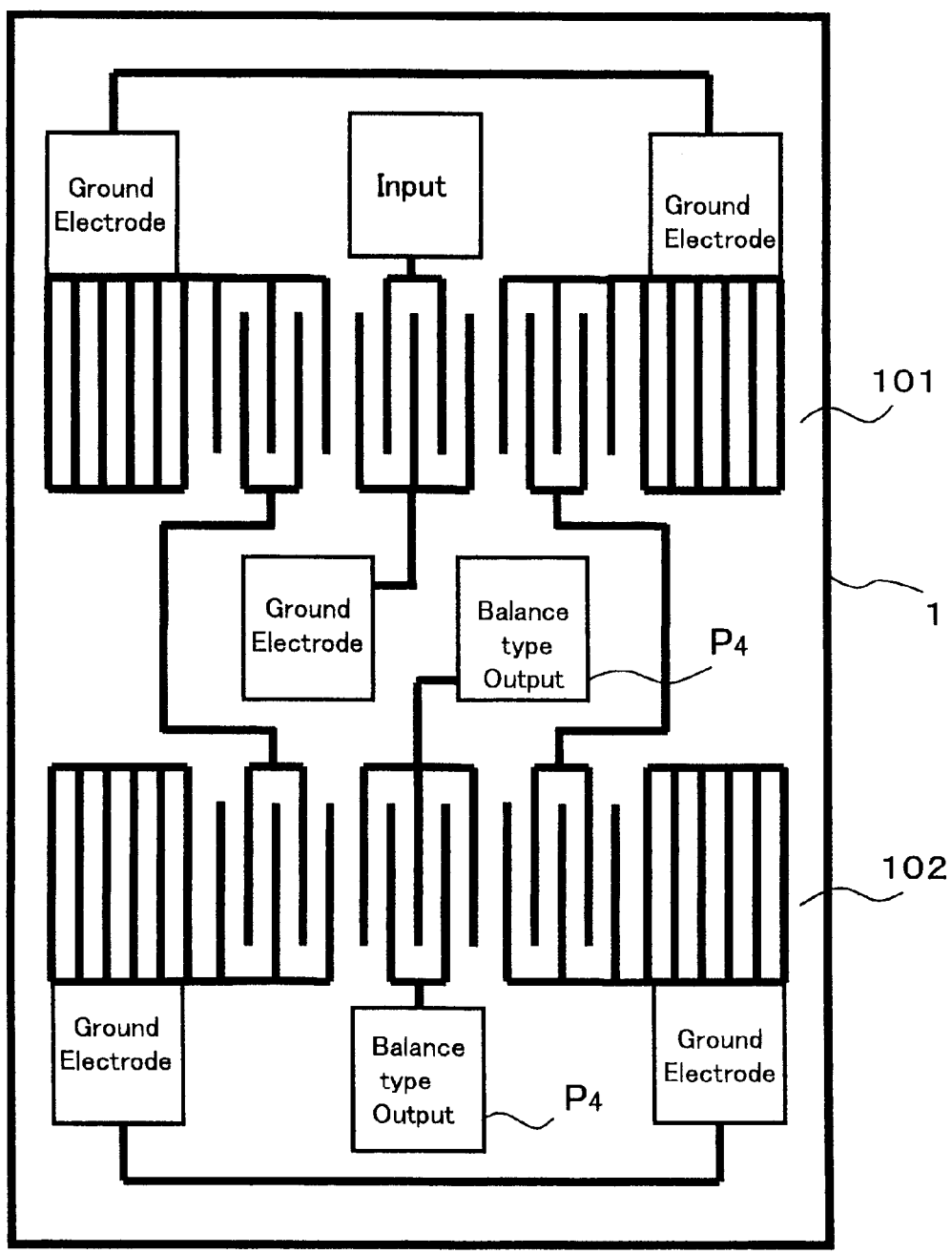
FIG. 8 is a top view of the piezoelectric element 1 forming another surface acoustic wave filter of a double mode type.

For example, FIGS. 6 to 8 are examples of the surface acoustic wave element having the other interdigital electrode structures. In particular, the example shown in FIG. 6 is one of an IIDT (Interdigitated Interdigital Transducer) type filter, and a side along the Z axis is set as the long side Lz, and in a relationship of the I/O electrode pads $P_1$, $P_2$, and in a relationship between the ground electrode pads $P_3$, they are disposed symmetrically.

FIG. 7 is an example of a cascade-connected double mode type filter, and the long side is set in a direction along the Z axis. In FIG. 7, a first double mode type filter 101 is cascade-connected to a second double mode type filter 102 via connection electrodes 103, 104, and a filter having higher selectivity is constituted by two-stages of the double mode type filter.

Furthermore, in FIG. 7 also, the electrode pads are disposed point-symmetrically to a center point of the piezoelectric element 1.

FIG. 8 is further a top view of the piezoelectric element 1 forming another surface acoustic wave filter of a double mode type. In particular, this is an example which has the two double mode type filters 101, 102 cascaded-connected, and is of a balance type in which the output is taken from the two output electrode pads $P_4$.

Figure 9:
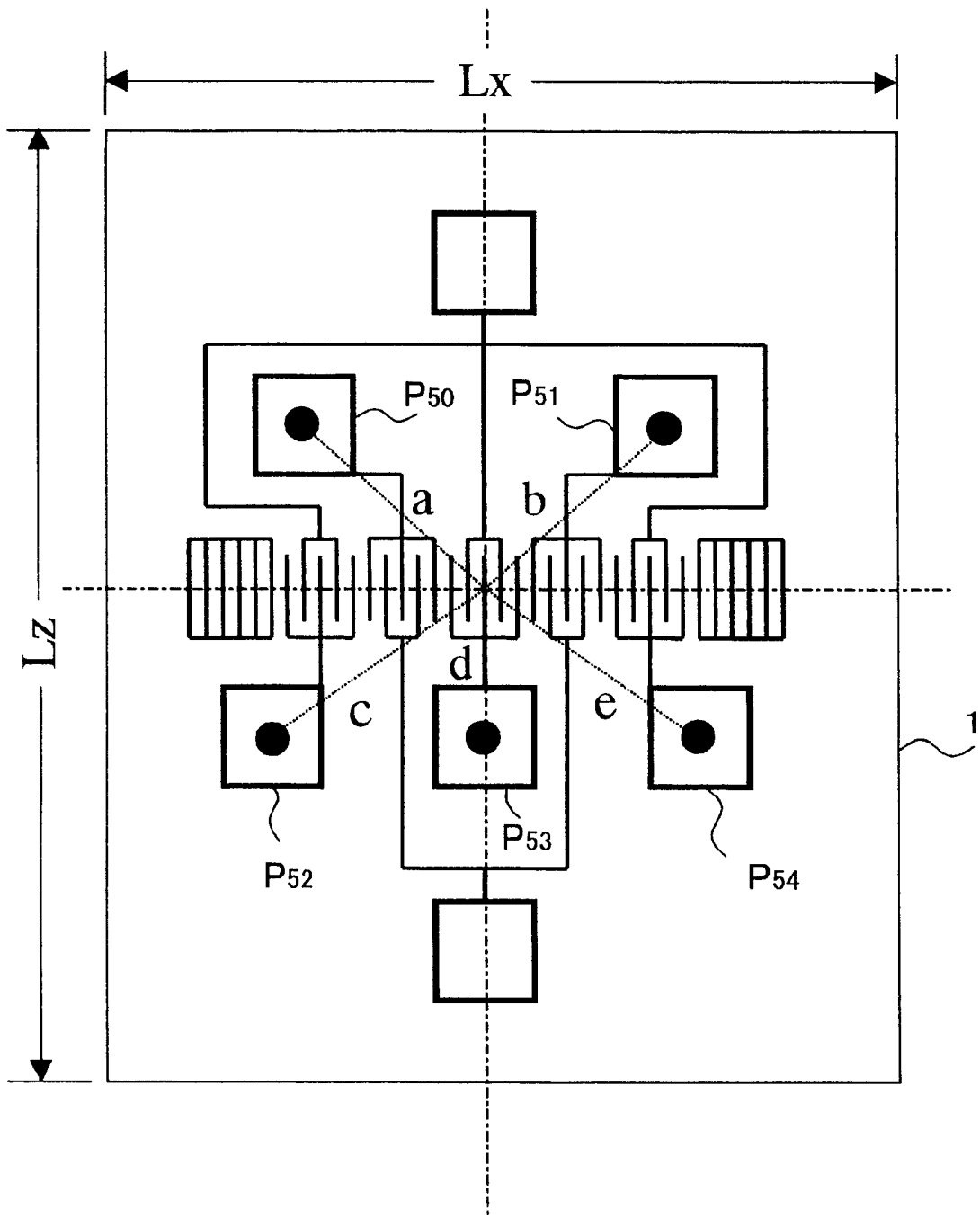
FIG. 9 is a view for explaining a characteristic of the present invention.

FIG. 9 is further a view for explaining a characteristic of the present invention. This embodiment also has a first characteristic of the present invention as explained previously, and the long side Lz is set in a direction having a crystal axis in which the coefficient of linear expansion is closer to the coefficient of linear expansion of the package 2. Furthermore, in the embodiment of FIG. 9, a distance from a central position of the piezoelectric element 1 to the electrode pads $P_{50}$ to $P_{54}$ is a length not exceeding half a length of the short side Lx.

Thus, it is possible to further reduce the stress load given to the bump in response to the electrode pads $P_{50}$ to $P_{54}$.

FIG. 10 is further a view showing an embodiment for explaining another characteristic of the present invention. This embodiment is one extending from a consideration that the position of the electrode pad of FIG. 9 is disposed at a distance close to a central position of the piezoelectric element 1.

Figures 10A, 10B:
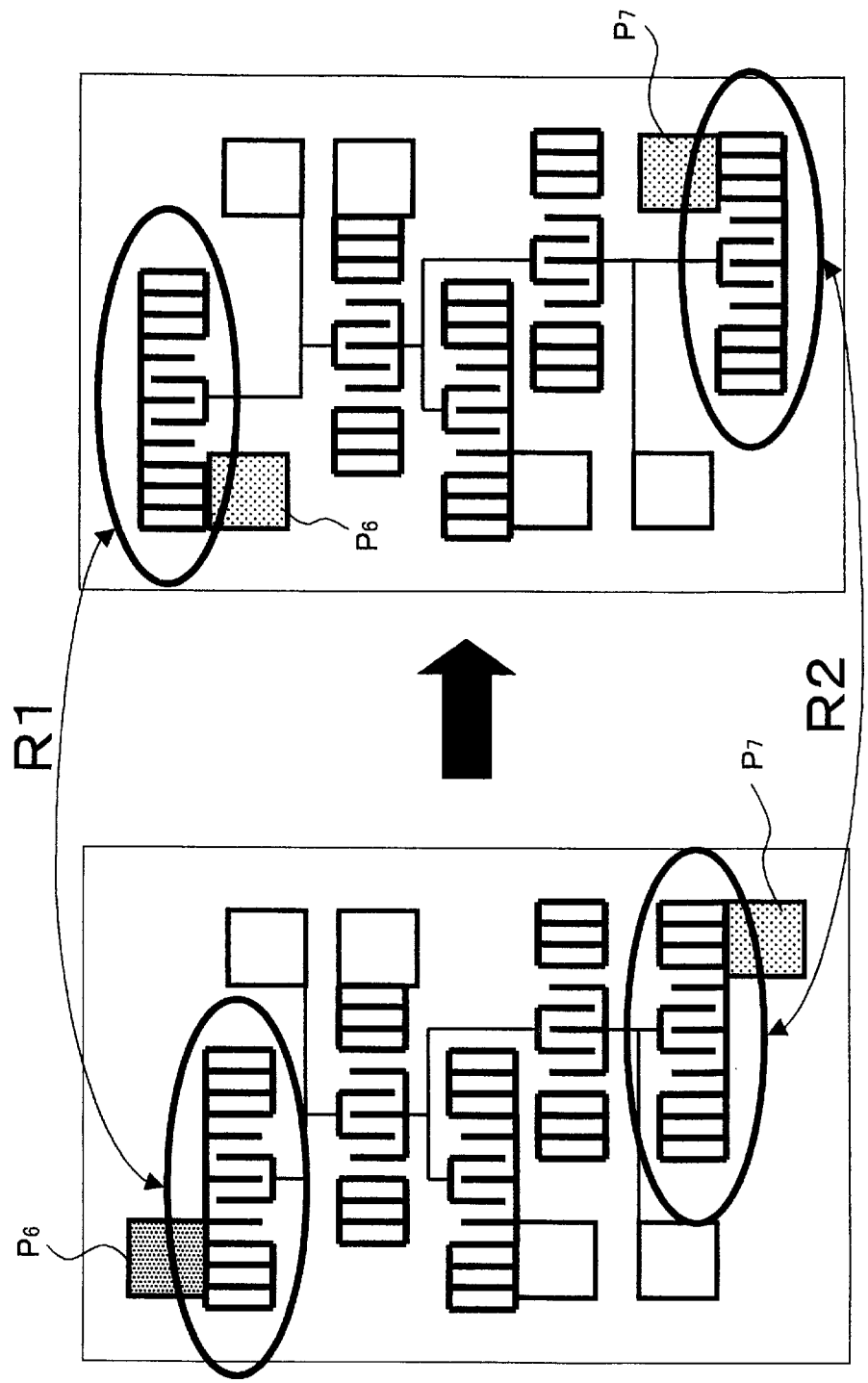
FIGS. 10A and 10B are views showing an embodiment for explaining another characteristic of the present invention.

That is, in the ladder type filter shown in FIG. 10A, a ground electrode pad $P_6$ of a parallel resonator R1 and a ground electrode page $P_7$ of a parallel resonator R2 are outside the parallel resonators R1, R2, respectively. Accordingly, as the extension of the characteristic of the present invention in FIG. 9, the ground electrode pads $P_6$ and $P_7$ are disposed inside the parallel resonators R1, R2, respectively, as shown in FIG. 10B.

Thus, it is possible to reduce the distance from the center of the piezoelectric element 1 of the ground electrode pads $P_6$ and $P_7$, and accordingly, it is possible to reduce the stress load given to the bump in response to the ground electrode pads $P_6$ and $P_7$.

Figure 11:
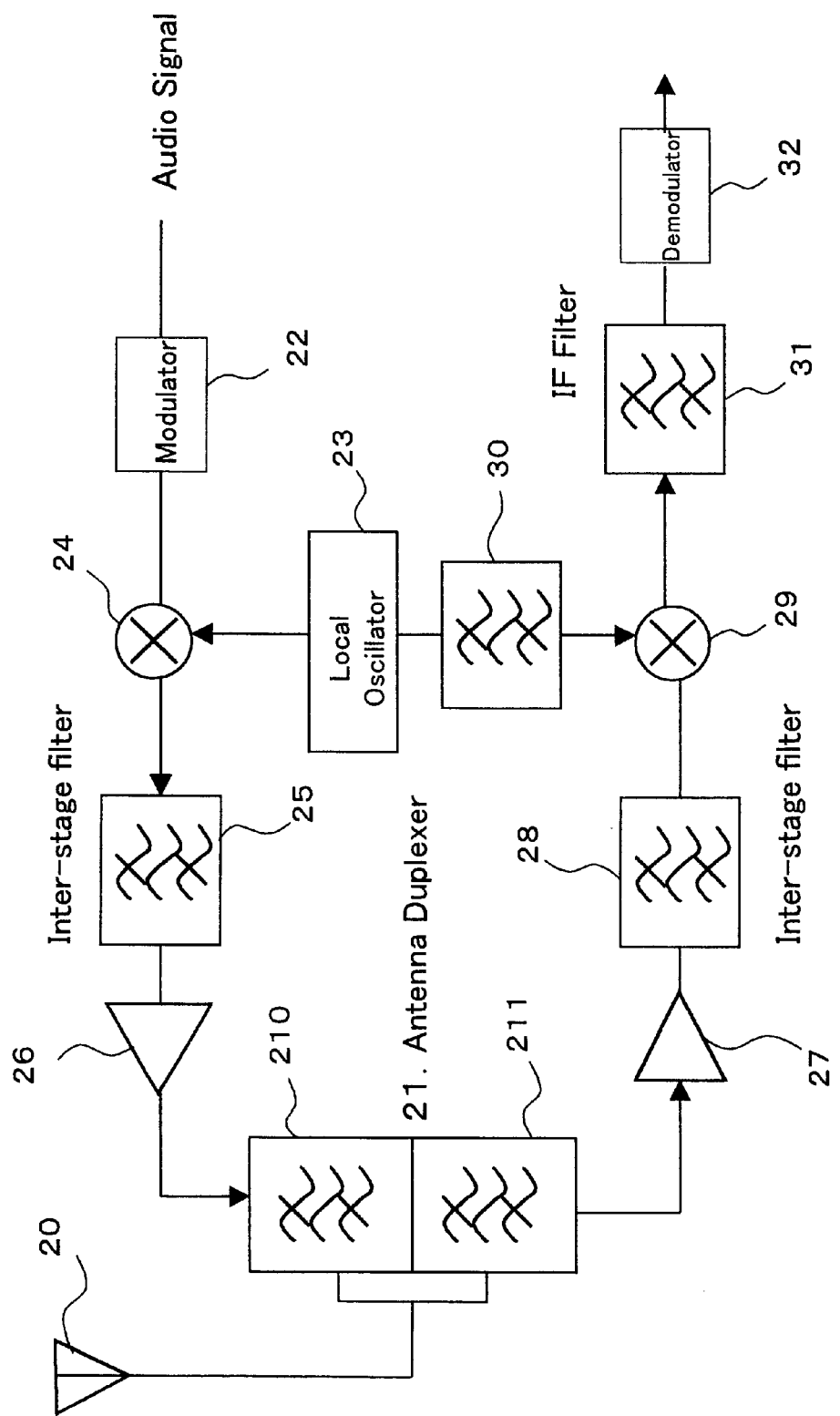
FIG. 11 is a block diagram centering a radio communication device, for example, a high frequency circuit of a portable telephone.

Here, the adaptation of the filter in the communication device will be considered. FIG. 11 is a block diagram centering a radio communication device, for example, a high frequency circuit of a portable telephone. An antenna duplexer 21 linked with an antenna 20 has a transmitting filter 210 and a receiving filter 211. The transmitting filter 210 and receiving filter 211 have a predetermined passing band, respectively, and the central frequencies are different.

The transmission side modulates transmitting IF signal with an audio or digital signal by means of a modulator 22 The modulated signal is mixed with a carrier signal from a local oscillator 23 by a mixer 24, and is transformed into a transmitting frequency band signal. Next, they pass an inter-stage filter 25, and are power-amplified by a power amplifier 26, and pass the transmitting filter 210 of the antenna duplexer 21, and are sent from the antenna 20.

On the other hand, the reception signals received by the antenna 20 pass the receiving filter 211 of the antenna duplexer 21, and are amplified by a pre-amplifier 27. The output of the pre-amplifier 27 is passed through an inter-stage filter 28 and is led to a mixer 29.

A frequency signal differing from a transmitting frequency is extracted by a filter 30 out of frequency signals output from the local part oscillator 23, and thus the received signals are converted into IF signals by the mixer 29. The converted IF signals are removed higher harmonics components by an IF filter 31, and are led to a demodulator 32 to demodulate.

Figure 12:
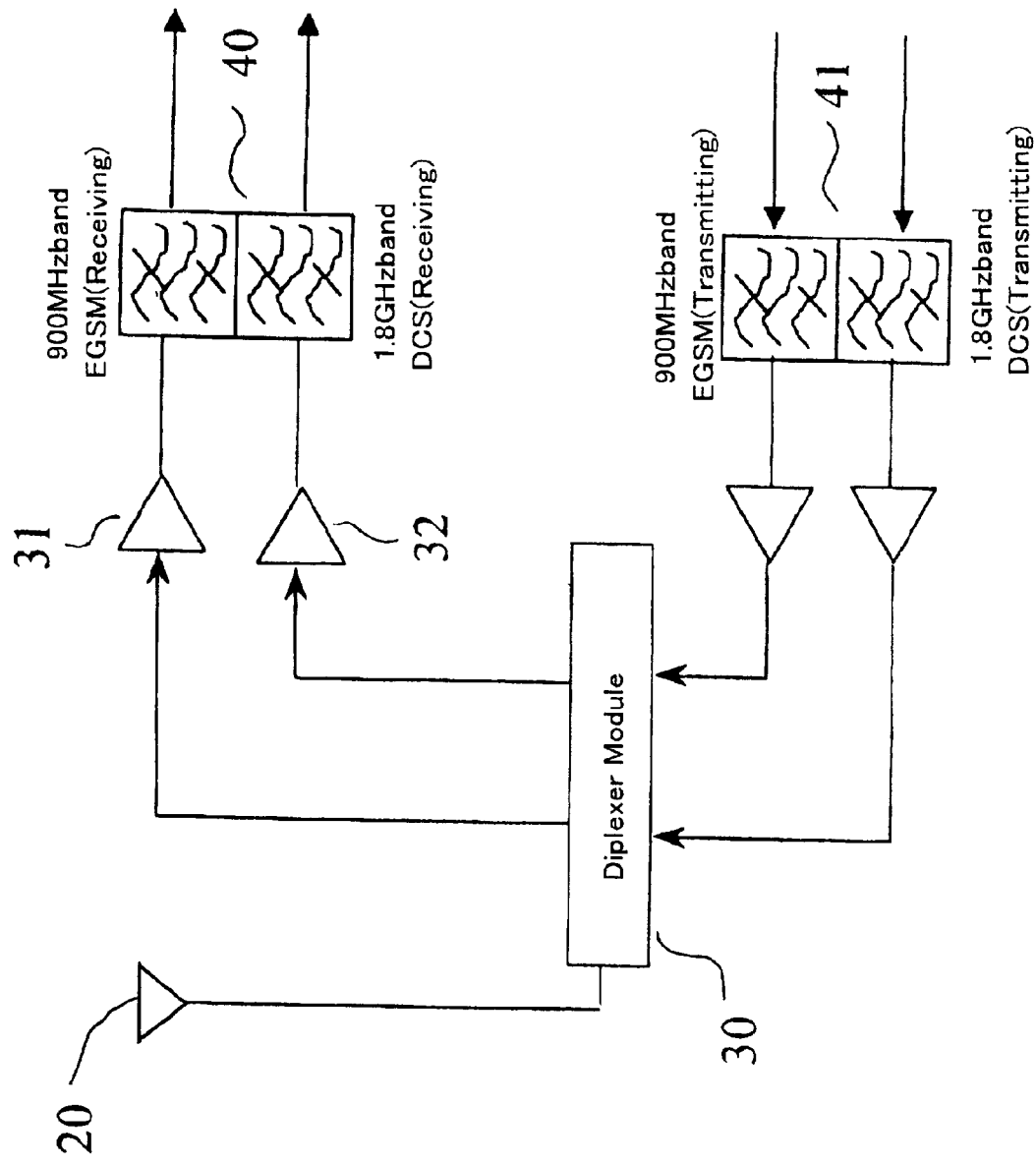
FIG. 12 is a block diagram centering another high frequency circuit of the portable telephone.

FIG. 12 is further a block diagram centering another high frequency circuit of a portable telephone. In particular, it is a schematic configuration of a high frequency circuit part of the portable telephone used in Europe. That is, one telephone is configured so as to correspond to two systems. This corresponds to an EGSM system having a frequency band of 900 MHz and a DCS system having a frequency band of 1.8 GHz.

For this reason, transmitting and receiving dual filters 40, 41 for each system are provided. Furthermore, in some cases, a SAW filter may be further mounted between a system linked with the antenna 20, and for example, a duplexer module 30 for separating transmitting and receiving signals, and amplifiers 31, 32.

Each latter stage of inter-stage filters 40, 41 is connected to a modulation and demodulation circuit in the same manner as the configuration in FIG. 11, and as this has no connection with the explanation of the present invention, the further explanation is omitted.

As understood readily from the description of FIGS. 11 and 12, in the case where the plurality of filters are used for the communication device, and the downsizing is demanded as in the portable telephone, a smaller-sized surface acoustic wave device is necessary for realizing these filters.

Figure 13:
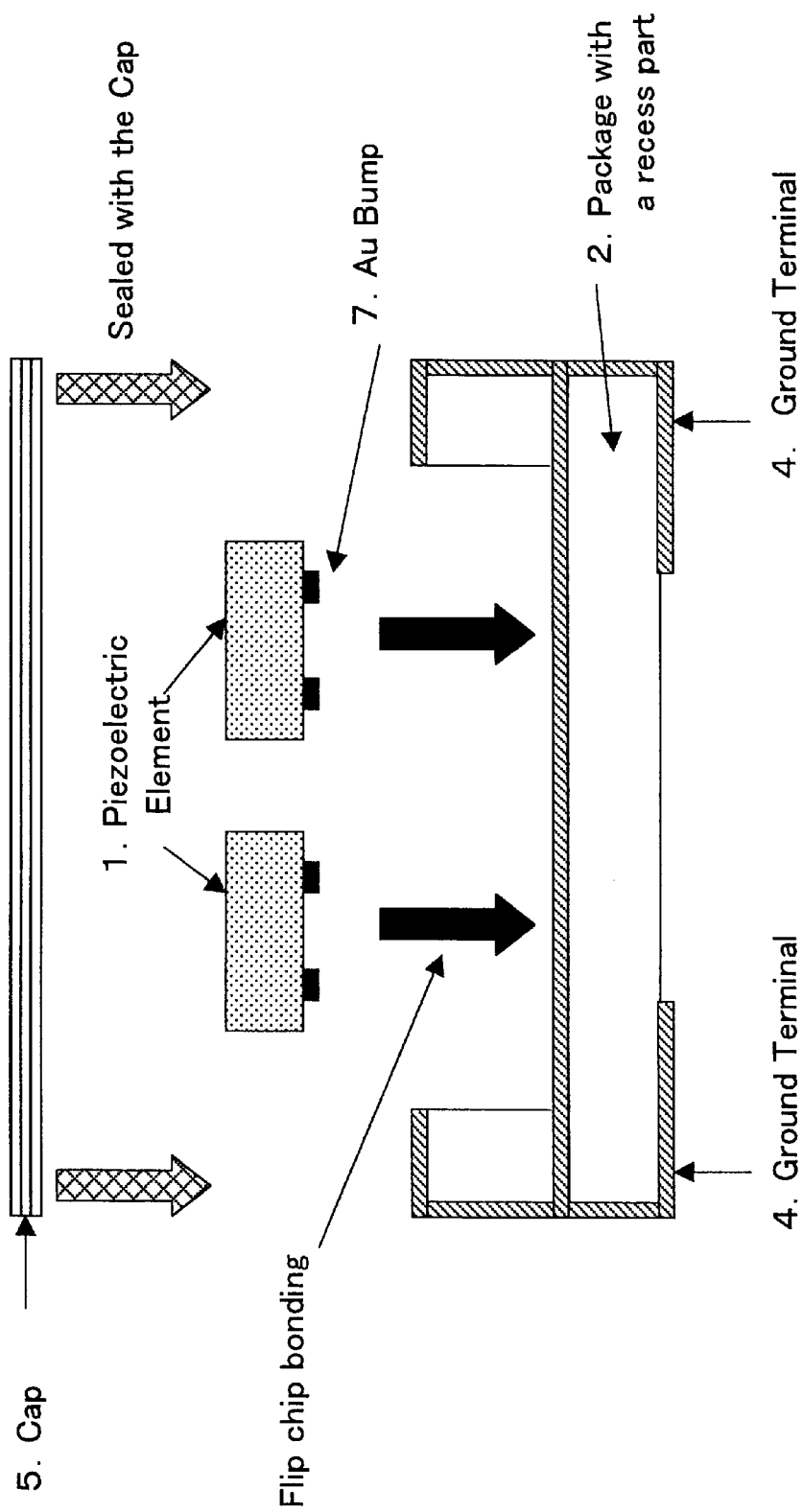
FIG. 13 is a view for explaining the embodiment in mounting the surface acoustic wave device according to the present invention in response to a demand in the small-sized surface acoustic wave device.
Figure 14:
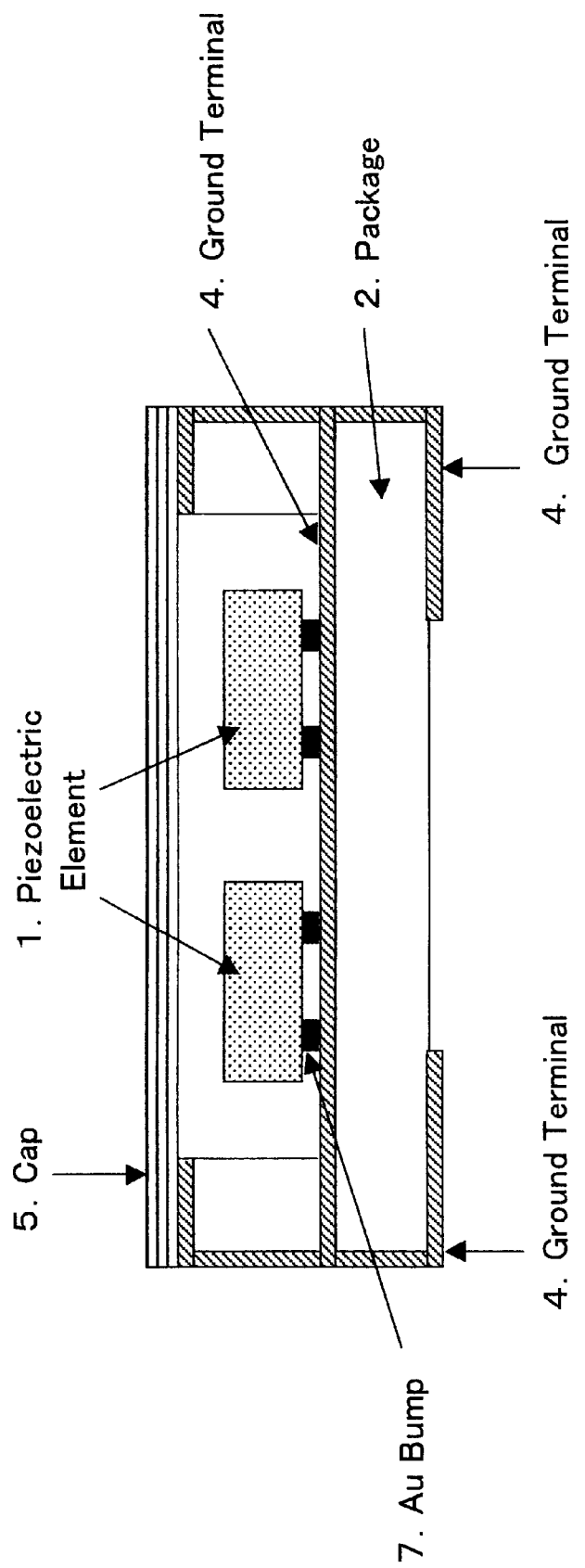
FIG. 14 is a view showing a condition after mounted according to the embodiment of FIG. 13 together with a view showing in a condition after mounted.

FIG. 13 is a view for explaining the embodiment in mounting the surface acoustic wave device according to the present invention in response to such demands. FIG. 14 is a view showing a condition after mounted. Such the embodiment is an example in which the two piezoelectric elements 1 having a previously explained characteristic of the present invention are mounted commonly in the package 2, and are sealed with the cap 5. The package 2 has a recess part, and the ground terminal and I/O terminal are connected to the electrode pad corresponding to the piezoelectric element 1 via the Au bump 7 to be fixed to each other.

Here, as explained previously, the long side of the piezoelectric element 1 is selected in an axial direction close to the coefficient of linear expansion of the package 2, and the electrode pads are disposed symmetrically to a center of the piezoelectric element 1. Accordingly, in FIG. 14, the stress for the bump 7 is decreased.

The example of FIG. 14 is one in which the ground electrode pads of the two piezoelectric elements 1 are commonly connected to the ground terminal 4 of the package 2.

Figure 15:
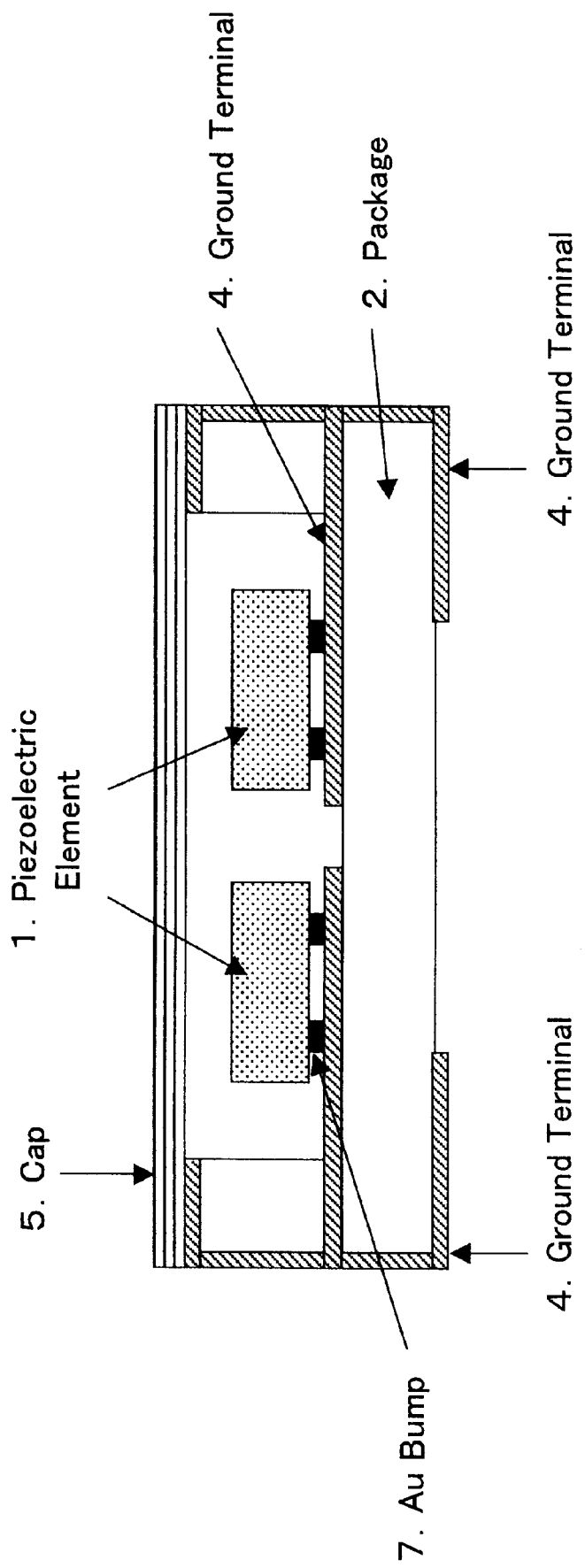
FIG. 15 is still another example, in which the ground electrode pads of the two piezoelectric elements 1 mounted on a common package 2 are separated into ground terminals 4 of the package 2 for connection.

FIG. 15 is still another example, in which the ground electrode pads of the two piezoelectric elements 1 mounted on the common package 2 are separated into the ground terminals 4 of the package 2 for connection. Thus, it is possible to prevent interference between the two piezoelectric elements 1.

Figure 16:
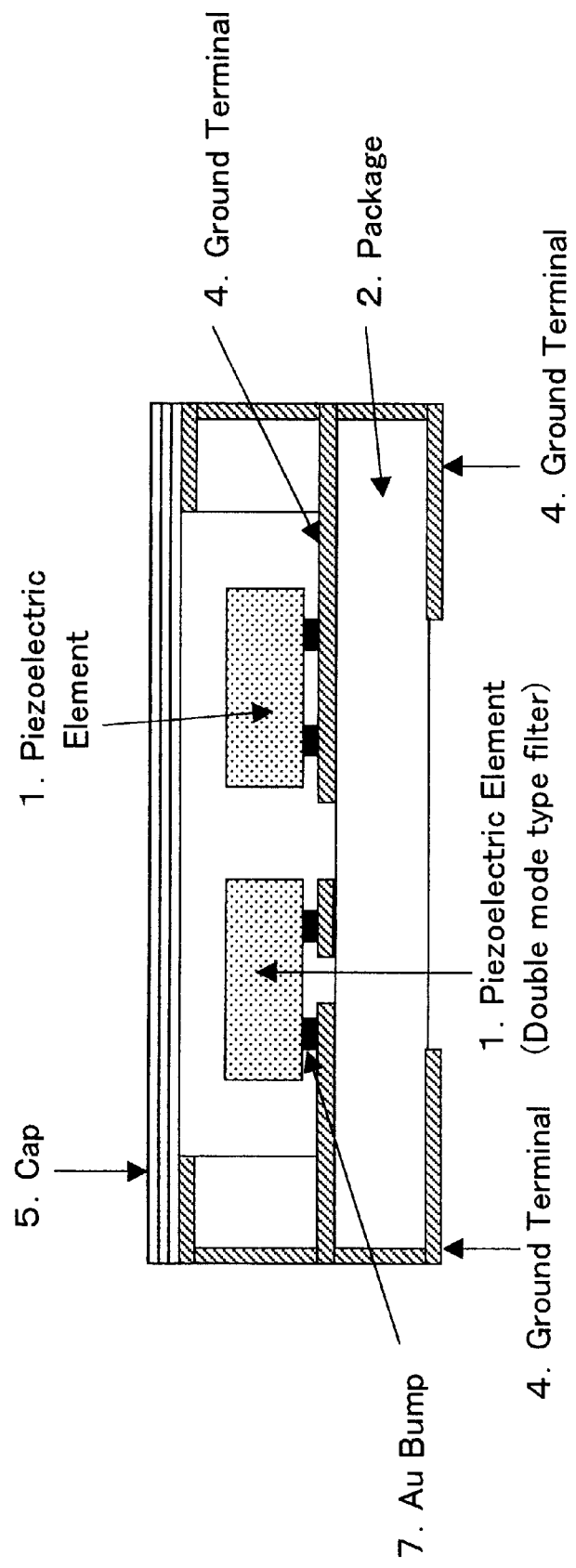
FIG. 16 is still another example, in which input and output ground electrode pads of a double mode type filter formed on the one piezoelectric element 1 are separated from each other to connect with the ground terminal 4 of the package 2.

FIG. 16 is still another example, in which input and output ground electrode pads of the two surface acoustic wave elements formed on the one piezoelectric element 1 are separated from each other to connect with the ground terminal 4 of the package 2. Thus, it is possible to prevent interference between the input and output.

Such example may be applied to the cascade-connected two-stage double mode type filter in the connection electrodes 103, 104 explained previously in FIG. 7, the single-stage double mode type filter, or the like.

Here, in FIGS. 13 to 16, the explanation was made in the example in which the two piezoelectric elements are mounted in the common package, but the adaptation of the present invention is not limited to such example. In the case where the two piezoelectric elements are mounted in the common package, they are figured as, for example, the antenna duplexer 21 in FIG. 11, or the dual filters 40, 41 in FIG. 12.

Furthermore, in the case where the two or more piezoelectric elements are mounted on the common package, for example, in FIG. 11, this configuration can be made so as to contain the inter-stage filter, IF filter, or a filter for another system.

Incidentally, in the description of the above embodiments, the description was made in the case where the single filter is configured on the single piezoelectric element, but the present invention is not limited thereto, and the two or more filters may be configured on the single piezoelectric element.

Hereinabove, the embodiments were described with reference to the drawings, and according to the present invention, it is possible to downsize with high reliability the surface acoustic wave device in which the piezoelectric element formed with the surface acoustic element by the flip chip bonding technology is mounted on the package.

What is claimed is:

1. A surface acoustic wave device, comprising:
   a package having a coefficient of linear expansion; and
   a piezoelectric element forming a surface acoustic wave element, and mounted on the package by a flip chip bonding, the piezoelectric element having different coefficients of linear expansion in a direction of propagation of surface acoustic waves generated by an interdigital electrode of the surface acoustic wave element and in a vertical direction thereto, and further having a long side existing to a direction having a coefficient of linear expansion closer to the coefficient of linear expansion of the package, and further having electrode patterns, and positions of bumps which connect the electrode patterns with the package are disposed point-symmetrically to a center of the piezoelectric element,
   the electrode patterns are formed so that a distance from a center of the piezoelectric element is ½ or less of a short side of the piezoelectric element.

2. The surface wave device according to claim 1, wherein the surface acoustic wave element has the electrode patterns configuring a ladder-type filter, and,
   wherein all positions of the bumps which connect the electrode patterns with the package are disposed at a side closer to a center of the piezoelectric element than a resonator disposed at a side of the short side of the ladder-type filter.

3. The surface acoustic wave device according to claim 1, wherein the surface acoustic wave element is a double mode type filter, in which an input side ground electrode and output side ground electrode of the filter are separated in the package.

4. A surface acoustic wave device, comprising:

a package having a coefficient of linear expansion; and two piezoelectric elements forming a surface acoustic wave element, and mounted on the package by a flip chip bonding, each of the two piezoelectric elements having different coefficients of linear expansion in the direction of propagation of surface acoustic waves generated by an interdigital electrode of the surface acoustic wave element and in a vertical direction thereto, and having a long side existing to a direction having a coefficient of linear expansion closer to the coefficient of linear expansion of the package, and further having respective different central frequencies, wherein ground electrodes of the surface acoustic wave elements formed respectively on the two piezoelectric elements are independent in the package.

5. The surface acoustic wave device according to claim 4, wherein the surface acoustic wave element formed in any one of the two piezoelectric elements is a cascade-connected double mode type filter, in which an input side ground electrode and output side ground electrode of the filter are separated in the package.

* * * * *

UNITED STATES PATENT AND TRADEMARK OFFICE
CERTIFICATE OF CORRECTION

PATENT NO. : 6,469,593 B2
DATED : October 22, 2002
INVENTOR(S) : Nishizawa et al.

It is certified that error appears in the above-identified patent and that said Letters Patent is hereby corrected as shown below:

<u>Title page,</u>
Item [75], Inventors, please amend the spelling of the third inventor's name as follows:
Change "Osamu Kawauchi" to -- Osamu Kawachi --.

Signed and Sealed this

Ninth Day of December, 2003

JAMES E. ROGAN
*Director of the United States Patent and Trademark Office*